(12) United States Patent
Wu et al.

(10) Patent No.: US 8,542,075 B2
(45) Date of Patent: Sep. 24, 2013

(54) STRUCTURE AND METHOD FOR REDUCING EM RADIATION, AND ELECTRIC OBJECT AND MANUFACTURING METHOD THEREOF

(75) Inventors: Tzong-Lin Wu, Taipei (TW);
Hao-Hsiang Chuang, Taipei (TW)

(73) Assignee: National Taiwan University, Taipei (TW)

( * ) Notice: Subject to any disclaimer, the term of this patent is extended or adjusted under 35 U.S.C. 154(b) by 328 days.

(21) Appl. No.: 13/070,271

(22) Filed: Mar. 23, 2011

(65) Prior Publication Data

US 2012/0188025 A1    Jul. 26, 2012

(30) Foreign Application Priority Data

Jan. 24, 2011    (TW) .............................. 100102527 A

(51) Int. Cl.
*H04B 3/28*    (2006.01)
(52) U.S. Cl.
USPC .............................. 333/12; 333/238; 333/246
(58) Field of Classification Search
USPC ............................................. 333/12, 238, 246
See application file for complete search history.

(56) References Cited

U.S. PATENT DOCUMENTS

| | | | |
|---|---|---|---|
| 6,624,729 B2 * | 9/2003 | Wright et al. .................. 333/238 |
| 6,737,883 B2 * | 5/2004 | Hall ................................ 326/26 |
| 7,530,043 B2 | 5/2009 | Hsu et al. |
| 7,655,870 B2 | 2/2010 | Chang et al. |
| 7,812,693 B1 * | 10/2010 | Acimovic ...................... 333/204 |
| 8,115,568 B2 * | 2/2012 | Hsu ................................... 333/33 |
| 8,324,979 B2 * | 12/2012 | Cho ................................... 333/4 |
| 2010/0181101 A1 | 7/2010 | Han et al. |

FOREIGN PATENT DOCUMENTS

| | | |
|---|---|---|
| TW | 554572 | 9/2003 |
| TW | 574768 | 2/2004 |
| TW | 200806106 | 1/2008 |

OTHER PUBLICATIONS

Hao-Hsiang Chuang, Tzong-Lin Wu, "A New Common-mode EMI Suppression Technique for GHz Differential Signals Crossing Slotted Reference Planes", 2010, p. 12-15, Department of Electronic Engineering and Graduate Institute of Communication Engineering,National Taiwan University (NTU), Taipei 10617, Taiwan, R.O.C.

* cited by examiner

*Primary Examiner* — Robert Pascal
*Assistant Examiner* — Kimberly Glenn
(74) *Attorney, Agent, or Firm* — WPAT, PC; Justin King

(57) ABSTRACT

A method for reducing EM radiation comprises at least one first resonance line disposed on one of electric surfaces, which is disposed at a side of a transmission line structure on one of the electric surface. The resonance line crosses over a slot of another electric surface. The slot is etched on a corresponding electric surface. In addition, the transmission line structure crosses over the slot of the electric surface. Then, the first resonance line connects the electric surface having the slot with another electric surface. It can adjust at least one of a length, a width and a shape of the first resonance line, to make an input impedance seen from a crossed point between the transmission line structure and the slot approximately 0.

25 Claims, 3 Drawing Sheets

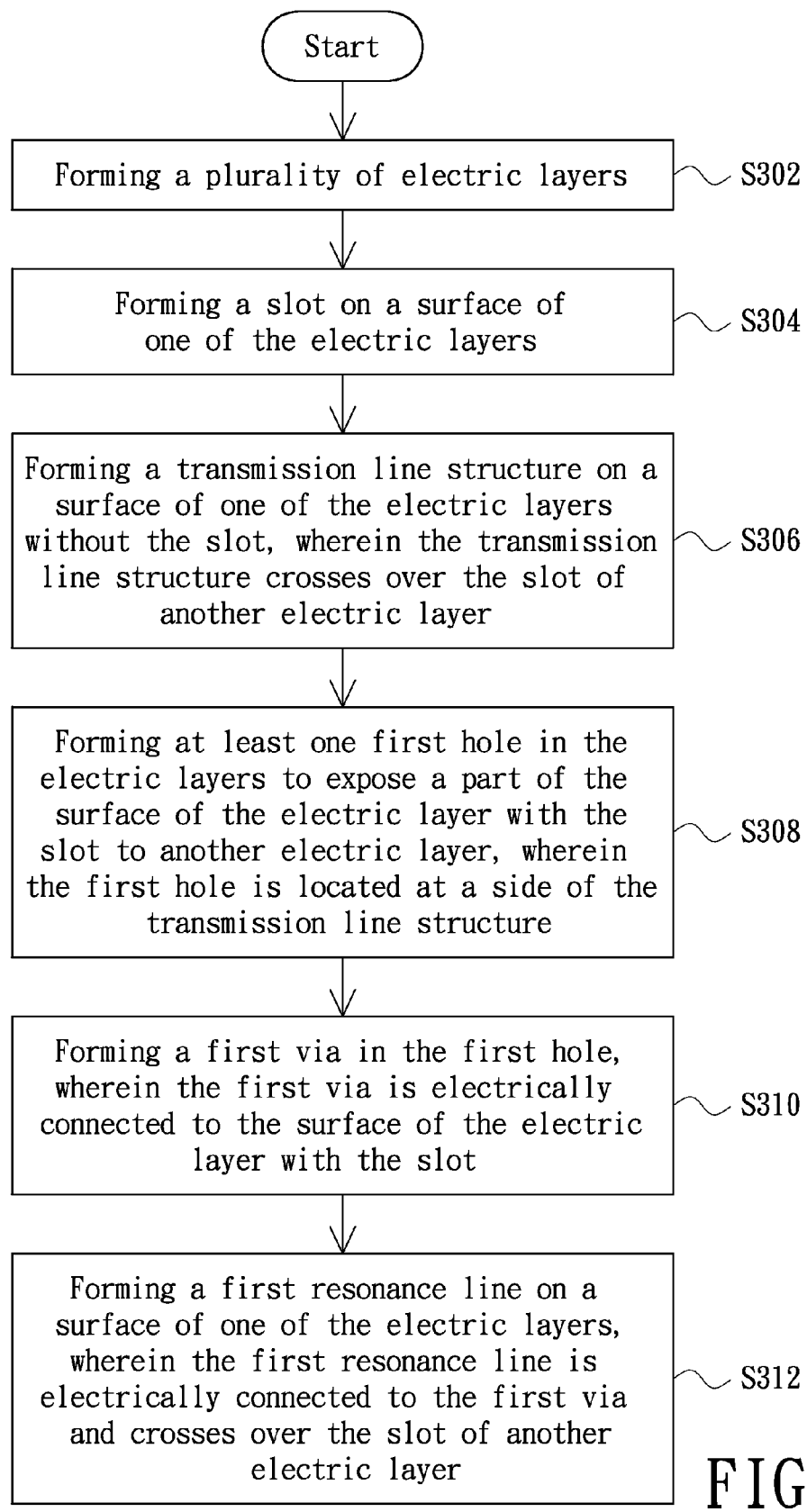

STRUCTURE AND METHOD FOR REDUCING EM RADIATION, AND ELECTRIC OBJECT AND MANUFACTURING METHOD THEREOF

FIELD OF THE INVENTION

The present invention relates to a technology for reducing EM (electromagnetic) radiation, and more particularly to a technology for reducing EM radiation generated by a structure of signal lines crossing over slots.

BACKGROUND OF THE INVENTION

With the rapid development of the science and technology, when active circuits operate in high-speed and operating frequencies thereof are increased, the active circuits require prompt supply of transient currents from the power distribution network (PDN) of package or printed circuit boards (PCBs). Then, simultaneous switching noises are generated to influence the normal operation of chips, and it is a problem which should be urgently solved. The conventional technology completely isolates the PCBs or a packaged structure by etching the slots between the power or ground layers, and it has been proved that it is very effectual to restrain the noise whose frequency is lower than GHz. Furthermore, it may design suitable slot structures to suppress the noise propagation within some specific frequency bands.

When a signal line passes through the slot structures, the discontinuous reference surface will result in serious degradation of signal quality because of the slot structures. Furthermore, if the frequency of passing signal thereof meets the resonance frequency of the slot structures, a part of the transmitted EM energy will excite the antenna-like slot to radiate outwards. To solve this kind of problems, the conventional technology employs the differential signal lines to transmit the signals. However, in the general PCB or package structure, it cannot avoid the asymmetry between two signal lines. For example, the differential signal lines may be bent due to the requirements of routing and this may cause unwanted common-mode noises propagating along the differential lines. The return current of the common-mode noise mainly passes through a reference surface below the differential signal transmission lines. Like the case of single-ended signal line, the energy of common-mode noise may radiate considerable energy by the slot structures, to generate the problems of the EM interference, etc.

The conventional technology is connecting two sides of the reference surface below and adjacent to the signal transmission lines by metal sheets, such that a direct-current (DC) level connection is formed between metal surfaces at two sides of the slot to provide a good electric connection, for solving the problem of the EM radiation generated by the signal transmission lines crossing over the gap or the slot of the reference surface. However, the conventional technology will break the original mechanism of restraining the noise transmission built by the slots. In addition, the conventional technology employs the DC connection, thus it is not adapted to a condition of two power layers with different voltage levels.

Currently, a common resolution is employing a SMT (surface mounted technique) capacitor, which are two terminals of connected to two ends of a slot and are adjacent to the signal transmission lines. Since the capacitor is electrical short in high frequencies, it can provide an excellent return current path when operating in the high frequencies. However, the parasitic effect of the SMT capacitor, such as the equivalent series inductors or resistors in series, will greatly influence the performances of the SMT capacitor, and the operation frequency thereof cannot be above GHz. In addition, the needs of SMT capacitor also increase the cost of the implementation.

SUMMARY OF THE INVENTION

The present invention provides a structure for reducing EM radiation and a method for reducing EM radiation, which are adapted for an electric object having a plurality of electric surfaces. Each of the electric surfaces is opposite to next one and spaced from each other by a predetermined thickness. In addition, a slot etches one of the electric surfaces to divide a corresponding electric surface into a plurality of sub electric surfaces. Multiple transmission lines are disposed on the electric surfaces without the slot. Furthermore, at least one of the transmission line structure crosses over the etched slot on the electric surface.

In addition, the present invention also provides an electric object and a manufacturing method thereof, such that the electric object can reduce the influence of EM radiation.

A structure for reducing EM radiation in accordance with an exemplary embodiment of the present invention is provided. The structure of the present invention comprises at least a first via and a first resonance line. The first via is located at one side of the transmission line structure, and connects the one side of the slot with another electric surface. The first resonance line electrically connects to the first via, and crosses over the slot structure.

In an exemplary embodiment, the structure further comprises a second via and the second resonance line. The second via and the first via are located at two sides of the transmission line structure, and connect the electric surface with the slot to another electric surface. The second resonance line electrically connects to the second via, and crosses over the slot located on another electric surface.

In addition, the first resonance line and the second resonance line can be located on a same electric surface or different electric surfaces respectively.

From another viewpoint, an electric object in accordance with another exemplary embodiment of the present invention is provided. The electric object of the present invention comprises a plurality of electric surfaces. Each of the electric surfaces is opposite to next one and spaced from each other by a predetermined thickness. A slot crosses one of the electric surfaces to divide the corresponding electric surface into a plurality of sub electric surfaces. Multiple transmission lines are disposed on the electric surfaces without the slot and at least one of the transmission lines crosses over the slot on another electric surface. The electric object of the present invention further comprises a first via and a first resonance line. The first via is located at one side of the transmission line structure for connecting the electric surface with the slot. In addition, the first resonance line electrically connects to the first via, and crosses over the slot located on the electric surface having the slot.

From another viewpoint, a method for reducing EM radiation in accordance with other exemplary embodiment of the present invention is provided. In the present invention, a first resonance line is disposed at one side of the transmission line structure located on one of the electric surfaces without the slot and the first resonance line crosses over the slot structure. Then, making the first resonance line connects to the electric surface with the slot, and adjusting its length, width, or shape of the first resonance line makes an input impedance seen into the slotline at the crossing point between the transmission line and the slot approximately 0.

From another viewpoint, a manufacturing method of an electric object in accordance with other exemplary embodiment of the present invention is provided. The exemplary embodiment is consist of a plurality of electric layers wherein each of the electric layers is opposite to the next one and spaced from each other by a predetermined thickness. In addition, a slot is etched on a surface of one of the electric layers. Furthermore, a transmission line structure is formed on a surface of one of the electric layers without the slot and crosses over the slot on another electric layer. Then, at least one first hole is formed in the electric layers to expose a part of the surface of the electric layer with the slot to the surface of another electric layer without the slot, wherein the first hole is located at a side of the transmission line structure. Additionally, a first via is formed in the first hole, wherein the first via is electrically connected to the surface of the electric layer with the slot. A first resonance line is further formed on a surface of one of the electric surfaces without the slot, wherein the first resonance line electrically connects to the first via and crosses over the slot of the electric surface having the slot.

In an exemplary embodiment of the present invention, the electric object is a circuit board or an integrated circuit.

In addition, the transmission line structure, the first resonance line and the second resonance line have a straight-line shape or any patterned shape. The transmission line structure comprises at least one signal line and at least one differential-signal line group.

In an exemplary embodiment of the present invention, the first via and the second via are located at different sides of the slot. Alternatively, the first via and the second via can be located at a same side of the slot.

In addition, the first resonance line and the transmission line structure may be located on the same or different electric surfaces respectively.

The present invention can adjust at least one of the lengths, the widths and the shapes of the first resonance line and the second resonance line, to make the input impedance seen into the slot line at the crossing point between the slot and the transmission line approximately 0. Therefore, the present invention can provide an excellent transmission route for a return current thereof, to reduce the influence of the EM radiation.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 3 is a flow chart of a manufacturing method of an electric object in accordance with an exemplary embodiment of the present invention.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
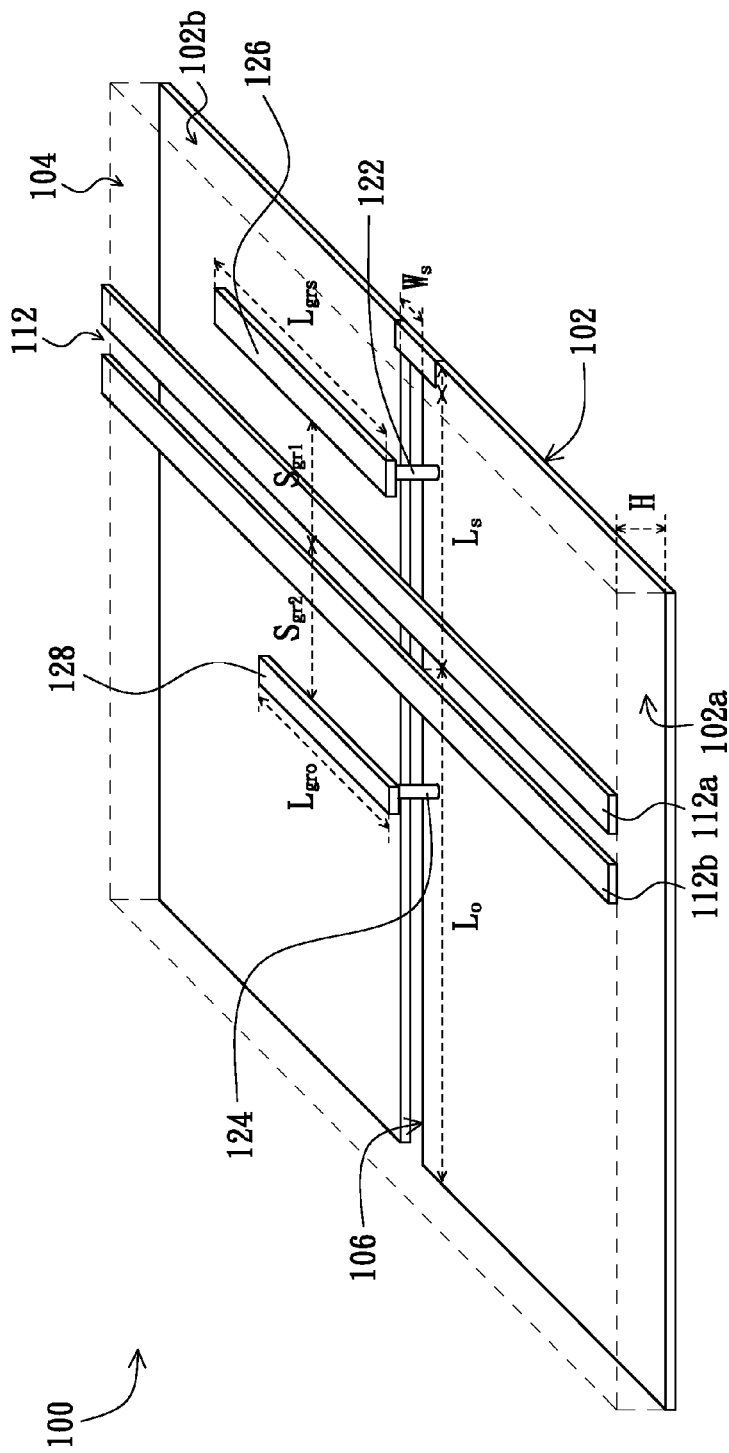
FIG. 1 is a structure view of an electric object in accordance with an exemplary embodiment of the present invention.

FIG. 1 is a structure view of an electric object in accordance with an exemplary embodiment of the present invention. Referring to FIG. 1, the electric object of the exemplary embodiment may be a circuit board 100, such as a printed circuit board, a flexible substrate or any of other circuit boards. In some other exemplary embodiments, the electric object 100 also may be an integrated circuit or any of other substrates. The electric object 100 of the exemplary embodiment has a plurality of electric surfaces, such as 102 and 104. These electric surfaces are opposite with each other, and each of the electric surfaces is spaced from another thereof with a predetermined thickness. For example, in the exemplary embodiment, the electric surfaces 102 and 104 are spaced from each other with the predetermined thickness H.

The electric surfaces include a reference level surface and a signal transmission surface. In the exemplary embodiment, the electric surface 102 may be the reference level surface, and the electric surface 104 may be the signal transmission surface. In some exemplary embodiment, a gap is etched between the electric surfaces 102 and 104.

In addition, although the electric object 100 is rectangular in the exemplary embodiment, the present invention is not limited herein.

On one of the electric surfaces, such as the electric surface 102 in the exemplary embodiment, a slot 106 may be disposed thereon for some specific reasons, such as restraining the noise transmission. A width of the slot 106 is $W_s$ and a length thereof is $L_o+L_s$. In the exemplary embodiment, $L_o$ is not equal to $L_s$. However, $L_o$ also may be equal to $L_s$ in some other exemplary embodiments. Since the slot 106 crosses the electric surface 102, the electric surface 102 is divided into a plurality of sub electric surfaces, such as 102a and 102b. The potentials of the sub electric surfaces 102a and 102b may be the same or different. In addition, in the exemplary embodiment, one end of the slot 106 is open and the other end thereof is short. However, the present invention is not limited herein.

On one of the electric surfaces without slot disposed thereon, such as the electric surface 104 in the exemplary embodiment, at least one transmission line structure 112 is disposed thereon for transmitting a signal, such as a DC (direct current) signal, a low-frequency signal or a high-frequency signal. In some exemplary embodiment, the signal line structure 112 comprises at least one signal line 112a. In the exemplary embodiment, the transmission line structure 112 comprises the signal lines 112a and 112b to form a pair of differential-signal line for transmitting differential signals. In other exemplary embodiments, the transmission line structure 112 may comprises multiple pairs of differential-signal lines.

Specifically, the transmission line structure 112 will cross over the slot 106 of another electric surface 102. In the exemplary embodiment, a length between a central dot of the transmission line structure 112 and the open end of the slot is $L_o$, and a length between the central dot of the transmission line structure 112 and the short end of the slot is $L_s$. Although the transmission line structure 112 of FIG. 1 is straight lines, the present invention is not limited herein. Persons skilled in the art can design the shape of the transmission line structure 112 themselves according to actual needs. On the other words, the shape of the transmission line structure 112 may be any of patterned shapes.

In the exemplary embodiment, the electric object 100 further comprises a structure for EM-radiation reducing, which at least comprises a via 122 and a resonance line 126. The via 122 is located at a side of the transmission line structure 112, for connecting the electric surface with the slot, such as the electric surface 102, with another electric surface, such as 104. In addition, the resonance line 126 is disposed on one of the electric surface without the slot, such as the electric surface 104, and is electrically connected to the via 122. Specifically, the resonance line 126 crosses over the below the slot 106.

The exemplary embodiment further comprises a via 124 and a resonance line 128. The via 124 and the via 122 may be disposed at the same side of the slot 106 or at different sides thereof respectively. Similarly, the via 124 can electrically connect the electric surface 102 with the slot 106 at another electric surface 104. The resonance line 128 is also disposed on one of the electric surfaces without the slot, such as the electric surface 104, and electrically connected to the via 124. Similarly, the resonance line 128 also crosses over the slot 106 of another electric surface 102. Although the resonance lines 126 and 128 are located on the same electric surface in the exemplary embodiment, the resonance lines 126 and 128 also may be located on the different electric surfaces respectively in other embodiments.

In the exemplary embodiment, lengths of the resonance lines 126 and 128 are $L_{gro}$ and $L_{grs}$ respectively. In addition, the resonance lines 124 and 126 are spaced from the center of the signal line structure 112 with distances $S_{gr1}$ and $S_{gr2}$ respectively. The resonance lines 124 and 126 may be straight lines or any patterned shape, and the present invention is not limited herein.

Figure 2:
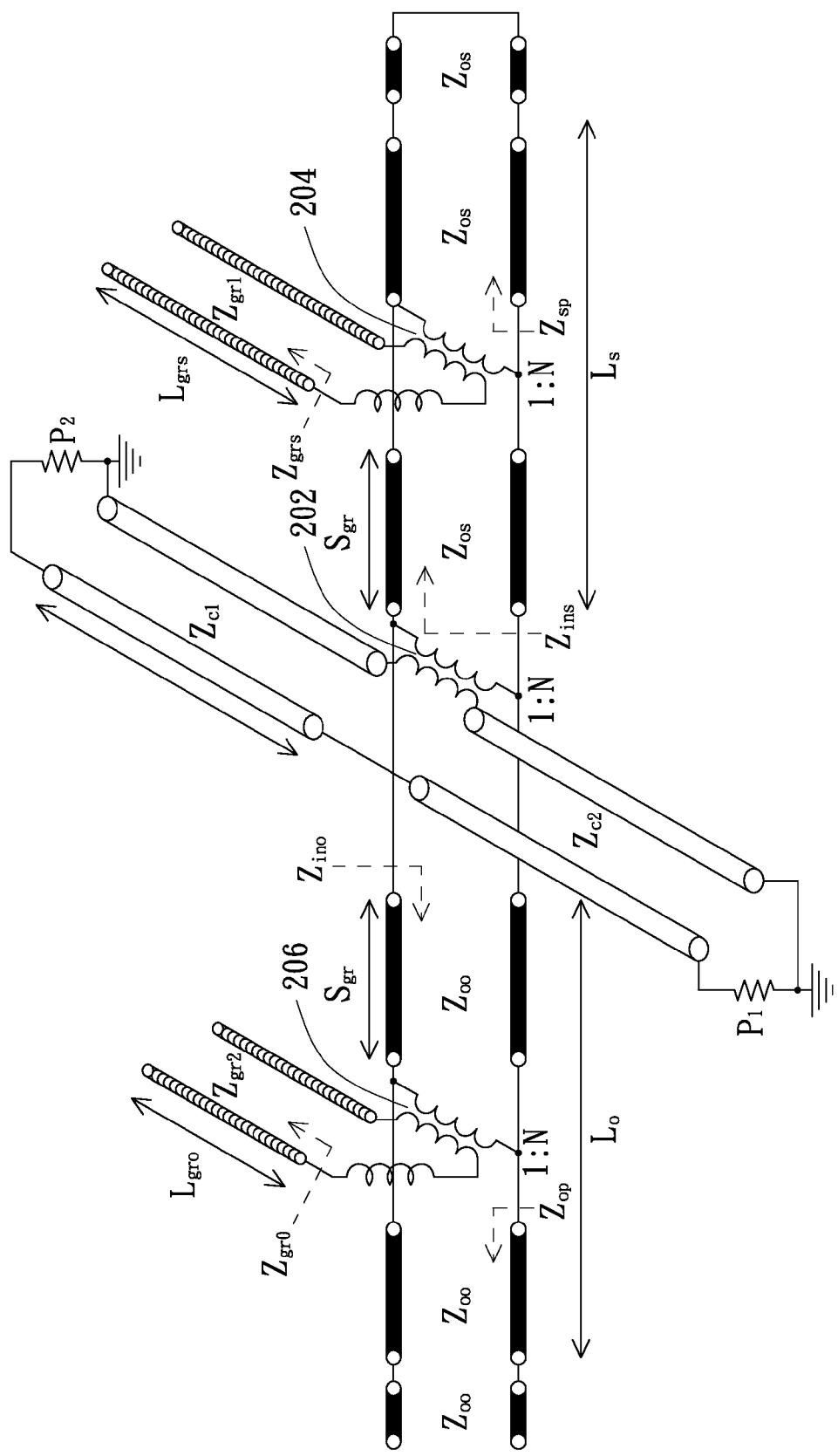
FIG. 2 is an equivalent circuit diagram of the electric object 100 of FIG. 1 when the differential line structure transmits the high frequency differential signal.

FIG. 2 is an equivalent circuit diagram of the electric object 100 of FIG. 1 when the transmission line structure 112 transmits the high frequency signal. Referring to FIGS. 1 and 2, when the transmission line structure 112 transmits the high frequency signal, the characteristic impedances of common-mode transmission lines of the transmission line structure 112 at two sides of the slot 106 are $Z_{C1}$ and $Z_{C2}$ respectively, and they are connected in series with each other. One terminal of the transmission line with the characteristic impedance of $Z_{C1}$ is connected to the port $P_1$. Similarly, the other terminal of another transmission line with the characteristic impedance of $Z_{C2}$ is connected to another port $P_2$.

In addition, the impedance $Z_{OS}$ is the characteristic impedance of the slot 106 adjacent to the short end by regarding the center of the transmission line structure 112 as a boundary, and the impedance $Z_{OO}$ is the characteristic impedance of the slot 106 adjacent to the open end. The slot lines with characteristic impedance $Z_{OS}$ and $Z_{OO}$ are connected in series. An equivalent transformer 202 is formed between the slot 106 and the transmission lines 112 and 114, and an equivalent turns ratio thereof is 1:N, wherein N is a positive number.

The characteristic impedance of the resonance line 126 is $Z_{gr1}$, and the characteristic impedance of the resonance line 128 is $Z_{gr2}$. Similarly, an ideal transformer 204 is connected with the resonance line 126 and the slot 106, and an ideal transformer 206 is also connected between the resonance line 128 and the slot 106. In the exemplary embodiment, the input impedance seen from a crossed point between the resonance line 126 and 106 is $Z_{grs}$, which can be achieved by a following formula:

$$Z_{grs} = -jZ_{gr1}\cot(\beta_{gr}L_{grs}) \quad (1)$$

Wherein $\beta_{gr}$ is a phase constant of the resonance lines 126 and 128.

In addition, the input impedance seen from a crossed point between the resonance line 128 and the slot 106 is $Z_{gro}$, which can be achieved by a following formula:

$$Z_{gro} = -jZ_{gr2}\cot(\beta_{gr}L_{gro}) \quad (2)$$

From the above formulas (1) and (2), it can be seen that the input impedances $Z_{grs}$ and $Z_{gro}$ are related to the lengths $L_{grs}$ and $L_{gro}$ of the resonance lines 126 and 128, respectively. In other words, it can modify the input impedances $Z_{grs}$ and $Z_{gro}$ by adjusting the lengths $L_{grs}$ and $L_{gro}$ of the resonance lines 126 and 128.

Although the exemplary embodiment adjusts the lengths $L_{grs}$ and $L_{gro}$ of the resonance lines 126 and 128 to adjust the input impedances $Z_{grs}$ and $Z_{gro}$, it also can adjust the widths or the shapes of the resonance lines 126 and 128 to modify the input impedances $Z_{grs}$ and $Z_{gro}$ in other embodiments.

When the high frequency signal is transmitted in the transmission lines 126 and 128 and crosses over the slot 106, it will excite the slot 106 to act like antenna. At the moment, it will generate EM radiation, which is resulted from the excitation of the return current below the transmission line structure 112. For reducing the influence of the return current to minimum, the input impedance seen from the crossed point between the transmission line structure 112 and the slot 106 should be 0, that is, it should be short.

In the exemplary embodiment, the input impedance seen from the crossed point between the transmission line structure 112 and the slot 106, is the input impedance $Z_{ins}$ and $Z_{ino}$ for the short end and open end of the slot, respectively. Meanwhile, they are connected in parallel. The input impedance $Z_{ins}$ may be achieved by a following formula:

$$Z_{ins} = Z_{OS}\frac{(Z_{sp} \| Z_{grs}) + jZ_{OS}\tan(\beta_S S_{gr1})}{Z_{OS} + j(Z_{sp} \| Z_{grs})\tan(\beta_S S_{gr1})} \quad (3)$$

Wherein $Z_{sp}$ is the input impedance of the short end of the slot 106 seen from the crossed point between the resonance line 126 and the slot 106. In addition, $\beta_s$ is the phase constant of the slot, which can be represented by a following formula:

$$\beta_S = \frac{2\pi}{\lambda_0}$$

Wherein $\lambda_0$ is a wavelength of the signal in vacuum.

In addition, the input impedance $Z_{ino}$ can be represented by a following formula:

$$Z_{ino} = Z_{OO}\frac{(Z_{op} \| Z_{gro}) + jZ_{OS}\tan(\beta_S S_{gr2})}{Z_{OO} + j(Z_{op} \| Z_{gro})\tan(\beta_S S_{gr2})} \quad (4)$$

Wherein $Z_{op}$ is the input impedance of the open end of the slot 106 seen from the resonance line 126 and the slot 106.

From the above formulas (3) and (4) it can be seen that, the input impedances $Z_{ins}$ and $Z_{ino}$ are related to the input impedances $Z_{grs}$ and $Z_{gro}$ respectively. From the above formulas (1) and (2), it can be seen that the input impedances $Z_{grs}$ and $Z_{gro}$ are related to the lengths $L_{grs}$ and $L_{gro}$ of the resonance lines 126 and 128, respectively. Therefore, it can adjust at least one of the lengths, the widths and the shapes of the resonance lines 126 and 128. Thus, $L_{grs}$ and $L_{gro}$ can make the input impedances $Z_{ins}$ and $Z_{ino}$ to be approximately 0. At the moment, the input impedance seen from the crossed point between the transmission line structure 112 and the slot 106 is approximately 0. Therefore, it can reduce the influence of the EM radiation.

FIG. 3 is a flow chart of a manufacturing method for an electric object in accordance with an exemplary embodiment of the present invention. Referring to FIG. 3, it firstly forms a plurality of electric layers as described in the step S302. The electric layers are opposite with each other, and each of the electric layers is spaced from another adjacent electric surface by a corresponding predetermined thickness. Then, a slot is etched on a surface at one of the electric layers as described in the step s304. The slot may divide the corresponding surface into a plurality of sub electric surfaces. In addition, a transmission line structure is formed on a surface of one of the electric layers without the slot, as described in the step S306. The transmission line structure crosses over the slot on the surface of another electric layer. Furthermore, at least a first hole is formed in the electric layers by an etching process to expose part of the electrical surface with the slot as described in the step S308. However, in some embodiments, a second hole is formed, wherein the second hole and the first hole are located at two sides of the transmission line structure. In addition, the first hole and the second hole may be located at the same side or the different sides of the slot.

Then, a first via is formed in the first hole as described in the step S310, to electrically connect the electric layer with the slot. In some embodiments, it further may form a second via in the said second hole, to also electrically connect the electric layer with the slot with another electric surface. In addition, at least a first resonance line is formed on one of the electric layers without the slot, as described in Step S312, and the first resonance line is electrically connected to the first via as described in the step S312. In some embodiments, it further forms a second resonance line on the electric layers without the slot, and the second resonance line is electrically connected to the second via. In these embodiments, the first resonance line and the second resonance line may be located on the same electric layer or the different electric layers respectively. In addition, specifically, the first resonance line and the second resonance line both cross over the slot of the surface of another electric layer.

In summary, the present invention at least has the following advantages:

Firstly, the present invention can adjust the lengths of the resonance lines, to modify the input impedance seen from the crossed point between the transmission line structure and the slot to be approximately 0, when the transmission line structure transmits the high frequency signal. Then, the present invention can reduce the influence generated by the EM radiation when the transmission line structure transmits the high frequency signal.

Secondly, since the present invention adjusts the lengths of the resonance lines to reduce the influence of the EM radiation, the present invention is easy to be performed.

Thirdly, since the input impedance seen from the crossed point between the transmission line structure and the slot is approximately 0, the present invention also can reduce the insertion loss generated by the signal transmitted in the transmission line structure crossing over the slot.

Fourthly, the present invention is implemented by slightly adjusting the manufacturing process of the electric object, and does not add any new hardware element. Thus, the present invention will not increase the fabrication cost of the electric object.

Fifthly, the present invention does not actually connect the sub electric surfaces at the two sides of the slot in actual. Therefore, it still can restrain the noise transmission.

Sixthly, since the present invention does not actually connect the sub electric surfaces at the two sides of the slot, the present invention also can be adapted into a condition of two sub electric surfaces with different voltage levels.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A structure for reducing EM radiation, adapted for an electric object having a plurality of electric surfaces, and each of the electric surfaces being opposite with next one and spaced from each other by a corresponding predetermined thickness, at least one slot crossing one of the electric surfaces to divide a corresponding electric surface into a plurality of sub electric surfaces, and at least one transmission line structure disposed on one of the electric surfaces without the slot and crossing over the slot of another electric surface, and the structure comprises:

a first via, connecting the electric surface with the slot to another electric surface, and positioning on one side of the transmission line structure; and a first resonance line, disposed on one of the electric surfaces without the slot, and electrically connected to the first via, wherein the first resonance line crosses over the slot located on another electric surface.

2. The structure according to claim 1, further comprising:

a second via, connecting the electric surface with the slot to another electric surface, and positioning on another side of the transmission line structure opposite to the first via; and a second resonance line disposed on one of the electric surfaces without the slot, and electrically connected to the second via, wherein the second resonance line crosses over the slot located on another electric surface.

3. The structure according to claim 2, wherein the first resonance line and the second resonance line are located on a same electric surface or different electric surfaces respectively.

4. The structure according to claim 2, wherein the first via and the second via are electrically connected to a sub electric surface at a same side of the slot or sub electric surfaces at different sides of the slot respectively.

5. The structure according to claim 1, wherein the first resonance line and the transmission line structure are located on a same electric surface or different electric surfaces respectively.

6. The structure according to claim 1, wherein the electric object is a circuit board.

7. The structure according to claim 1, wherein the electric object is an integrated circuit.

8. The structure according to claim 1, wherein the first resonance line has a straight-line shape or a patterned shape.

9. The structure according to claim 1, wherein at least one of the electric surfaces is used as a reference surface.

10. The structure according to claim 1, wherein at least one of the electric surfaces is used as a signal transmission surface.

11. An electric object, comprising:

a plurality of electric surface, each thereof being opposite with next one and being spaced from each other by a corresponding predetermined thickness;

a slot, crossing one of the electric surfaces to divide the corresponding electric surface into a plurality of sub electric surfaces;

at least one transmission line structure, positioning on one of the electric surfaces without the slot, and crossing over the slot of another electric surface;

a first via, connecting the electric surface with the slot to another electric surface, and positioning on a side of the transmission line structure; and a first resonance line, disposed on one of the electric surfaces without the slot, and electrically connected to the first via, wherein the first resonance line crosses over the slot located on another electric surface.

12. The electric object according to claim 11, further comprising:

a second via, connecting the electric surface with the slot to another electric surface, and positioning on another side of the transmission line structure opposite to the first via; and a second resonance line, disposed on one of the electric surfaces without the slot, and electrically connected to the second via, wherein the second resonance line crosses over the slot located on another electric surface.

13. The electric object according to claim 12, wherein the first resonance line and the second resonance line are located on a same electric surface or different electric surfaces respectively.

14. The electric object according to claim 12, wherein the first via and the second via are electrically connected to one of the plurality of sub electric surface at a same side of the slot or sub electric surfaces at different sides of the slot respectively.

15. The electric object according to claim 11, wherein the first resonance line and the transmission line structure are located on a same electric surface or different electric surfaces respectively.

16. The electric object according to claim 11, wherein the transmission line structure comprises at least one signal transmission line.

17. The electric object according to claim 11, wherein the transmission line structure comprises at least one differential-signal transmission line group.

18. The electric object according to claim 11, wherein the transmission line structure has a straight-line shape or a patterned shape.

19. The electric object according to claim 11, wherein the first resonance line has a straight-line shape or a patterned shape.

20. A method for reducing EM radiation, adapted for an electric object having a plurality of electric surfaces, and each of the electric surfaces being opposite with next one and spaced from each other by a corresponding predetermined thickness, a slot crossing one of the electric surfaces to divide the corresponding electric surface into a plurality of sub electric surfaces, and at least one transmission line structure disposed on one of the electric surfaces without the slot, and the method comprises:

disposing a first resonance line at one side of the transmission line structure on one of the electric surfaces without the slot, and making the first resonance line crossing over the slot located on another electric surface;

connecting the first resonance line to the electric surface with the slot; and adjusting at least one of a length, a width and a shape of the first resonance line, to make an input impedance seen from a crossed point between the transmission line structure and the slot approximately 0.

21. The method according to claim 20, further comprising:

disposing a second resonance line on one of the electric surfaces without the slot, the second resonance line and the first resonance line being located at two sides of the transmission line structure respectively;

connecting the second resonance line to the electric surface with the slot; and adjusting at least one of a length, a width and a shape of the second resonance line cooperated with the first resonance line, to make the input impedance seen from the crossed point between the transmission line structure and the slot approximately 0.

22. The method according to claim 21, wherein the first resonance line and the second resonance line are electrically connected to one of the plurality of sub electric surface at the same side of the slot or one of the plurality of sub electric surfaces at different sides of the slot, respectively.

23. The method according to claim 20, wherein the first resonance line has a straight-line shape or a patterned shape.

24. A manufacturing method of an electric object, comprising:

forming a plurality of electric layers, and making each of the electric layers with corresponding predetermined thickness respectively opposite to next one;

forming a slot on a surface of one of the electric layers;

forming a transmission line structure on a surface one of the electric surfaces without the slot, and making the transmission line structure crossing over the slot positioning on another electric layer;

forming at least one first hole in the electric layers to expose a part of the surface of electric layer with the slot to the surface of another electric layer, wherein the first hole being located at one side of the transmission line structure;

forming a first via which is connected to a surface of the electric layer with the slot in the first hole; and forming a first resonance line on a surface of one of the electric layers without the slot, and making the first resonance line being electrically connected to the first via and crossing over the slot on another electric layer.

25. The manufacturing method according to claim 24, further comprising:

forming at least one second hole in the electric layers to expose a part of the surface of the electric layer with the slot to another electric surface, the second hole and the first hole being located at two sides of the transmission line structure;

forming a second via in the second hole, and making the second via being electrically connected to the surface of the electric layer with the slot; and forming a second resonance line on a surface of one of the electric layers without the slot, and making the second resonance line being electrically connected to the second via and crossing over the slot of the electric surface having the slot.

* * * * *